(12) United States Patent
Park et al.

(10) Patent No.: US 11,211,462 B2
(45) Date of Patent: Dec. 28, 2021

(54) USING SELECTIVELY FORMED CAP LAYERS TO FORM SELF-ALIGNED CONTACTS TO SOURCE/DRAIN REGIONS

(71) Applicant: International Business Machines Corporation, Armonk, NY (US)

(72) Inventors: Chanro Park, Clifton Park, NY (US); ChoongHyun Lee, Rensselaer, NY (US); Kangguo Cheng, Schenectady, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/810,114

(22) Filed: Mar. 5, 2020

(65) Prior Publication Data

US 2021/0280690 A1    Sep. 9, 2021

(51) Int. Cl.
| | | |
|---|---|---|
| *H01L 29/417* | (2006.01) | |
| *H01L 27/088* | (2006.01) | |
| *H01L 29/49* | (2006.01) | |
| *H01L 29/78* | (2006.01) | |
| *H01L 27/12* | (2006.01) | |
| *H01L 29/66* | (2006.01) | |
| *H01L 21/02* | (2006.01) | |

(52) U.S. Cl.
CPC .... *H01L 29/41791* (2013.01); *H01L 27/0886* (2013.01); *H01L 27/1211* (2013.01);
(Continued)

(58) Field of Classification Search
CPC ..... H01L 21/823431; H01L 21/823468; H01L 21/28247; H01L 21/76834;
(Continued)

(56) References Cited

U.S. PATENT DOCUMENTS 8,440,533 B2    5/2013    Toh et al.
8,741,723 B2    6/2014    Chi
(Continued)

OTHER PUBLICATIONS

Y. Kamata et al., "Material Properties, Thermal Stabilities and Electrical Characteristics of Ge MOS Devices, Depending on Oxidation States of Ge Oxide: Monoxide [GeO(II)] and Dioxide [GeO2(IV)]," Symposium C—CMOS Gate-Stack Scaling-Materials, Interfaces and Reliability Implications, 2009, 8 pages, vol. 1155.

*Primary Examiner* — Errol V Fernandes
*Assistant Examiner* — Jeremy J Joy
(74) *Attorney, Agent, or Firm* — Abdy Raissinia; Ryan, Mason & Lewis, LLP (57) ABSTRACT

A method for manufacturing a semiconductor device includes forming a plurality of gate structures on a semiconductor fin, and forming a plurality of source/drain regions adjacent the plurality of gate structures. In the method, a germanium oxide layer is formed on the plurality of gate structures and on the plurality of source/drain regions, and portions of the germanium oxide layer on the plurality of source/drain regions are converted into a plurality of dielectric layers. The method also includes removing unconverted portions of the germanium oxide layer from the plurality of gate structures, and depositing a plurality of cap layers in place of the removed unconverted portions of the germanium oxide layer. The plurality of dielectric layers are removed, and a plurality of source/drain contacts are formed on the plurality of source/drain regions. The plurality of source/drain contacts are adjacent the plurality of cap layers.

16 Claims, 8 Drawing Sheets

(52) U.S. Cl.
CPC .. *H01L 29/41766* (2013.01); *H01L 29/41775* (2013.01); *H01L 29/4983* (2013.01); *H01L 29/7851* (2013.01); H01L 21/02164 (2013.01); H01L 21/02255 (2013.01); H01L 29/6656 (2013.01); H01L 29/66515 (2013.01); H01L 29/66795 (2013.01)

(58) Field of Classification Search
CPC ....... H01L 21/02362; H01L 21/823475; H01L 21/76897; H01L 27/0886; H01L 27/1211; H01L 29/66795; H01L 29/6681; H01L 29/785–7851; H01L 29/41791; H01L 29/66515; H01L 29/4983; H01L 29/6656; H01L 29/41766
See application file for complete search history.

(56) References Cited

U.S. PATENT DOCUMENTS

| | | |
|---|---|---|
| 9,054,178 B2 | 6/2015 | Bohr et al. |
| 9,153,498 B2 | 10/2015 | Xie et al. |
| 9,224,735 B2 | 12/2015 | Glass et al. |
| 9,257,529 B2 | 2/2016 | Metz |
| 9,293,576 B2 | 3/2016 | Cheng et al. |
| 9,515,163 B2 | 12/2016 | Xie et al. |
| 9,673,101 B2 | 6/2017 | Ok et al. |
| 2008/0128763 A1* | 6/2008 | Rachmady ........ H01L 21/76897 257/288 |
| 2011/0156107 A1* | 6/2011 | Bohr .................... H01L 29/4966 257/288 |
| 2013/0175619 A1* | 7/2013 | Fan .................... H01L 21/76897 257/347 |
| 2014/0197468 A1* | 7/2014 | Xie ..................... H01L 29/6656 257/288 |
| 2014/0361352 A1* | 12/2014 | Hung ................ H01L 29/66545 257/288 |
| 2015/0041926 A1* | 2/2015 | Pradhan ............ H01L 29/66795 257/412 |
| 2016/0035724 A1* | 2/2016 | Pradhan .............. H01L 29/0653 257/383 |
| 2018/0026100 A1 | 1/2018 | Jagannathan et al. |
| 2018/0076040 A1 | 3/2018 | Ando et al. |
| 2019/0295889 A1* | 9/2019 | Bai .................. H01L 21/76831 |
| 2020/0279933 A1* | 9/2020 | Cheng ............... H01L 21/76885 |

* cited by examiner

USING SELECTIVELY FORMED CAP LAYERS TO FORM SELF-ALIGNED CONTACTS TO SOURCE/DRAIN REGIONS

BACKGROUND

Semiconductor devices are being manufactured using non-self-aligned contacts (non-SACs) due to simpler manufacturing processes and lower cost. However, as semiconductor devices, such as, for example, complementary metal-oxide semiconductor (CMOS) devices are continuously being scaled down to smaller dimensions, non-SAC processes are difficult to implement. For example, non-SAC processes are difficult to implement without sacrificing contact resistance beyond 7 nm, where gate pitch would be less than 50 nm.

SUMMARY

According to an exemplary embodiment of the present invention, a method for manufacturing a semiconductor device includes forming a plurality of gate structures on a semiconductor fin, and forming a plurality of source/drain regions adjacent the plurality of gate structures. In the method, a germanium oxide layer is formed on the plurality of gate structures and on the plurality of source/drain regions, and portions of the germanium oxide layer on the plurality of source/drain regions are converted into a plurality of dielectric layers. The method also includes removing unconverted portions of the germanium oxide layer from the plurality of gate structures, and depositing a plurality of cap layers in place of the removed unconverted portions of the germanium oxide layer. The plurality of dielectric layers are removed, and a plurality of source/drain contacts are formed on the plurality of source/drain regions. The plurality of source/drain contacts are adjacent the plurality of cap layers.

According to an exemplary embodiment of the present invention, a semiconductor device includes a plurality of gate structures disposed on a semiconductor fin, and a plurality of spacers disposed on sides of the plurality of gate structures. A plurality of cap layers are disposed on the plurality of gate structures and on the plurality of spacers, and a plurality of source/drain regions are disposed adjacent the plurality of gate structures. The semiconductor device also includes a plurality of source/drain contacts disposed on a plurality of source/drain regions. The plurality of source/drain contacts are disposed between the plurality of cap layers and the plurality of gate structures.

According to an exemplary embodiment of the present invention, a method for manufacturing a semiconductor device includes forming at least two gate structures on a semiconductor fin, and forming a source/drain region between the at least two gate structures. In the method, a first dielectric layer is formed on the source/drain region and is recessed with respect to top surfaces of the at least two gate structures. A semiconductor layer comprising germanium is formed on the first dielectric layer, and a sacrificial layer is formed on the at least two gate structures and on the semiconductor layer comprising germanium. The method also includes converting a portion of the sacrificial layer on the semiconductor layer comprising germanium into a second dielectric layer, and removing unconverted portions of the sacrificial layer from the at least two gate structures. A plurality of cap layers are deposited in place of the removed unconverted portions of the sacrificial layer. The first and second dielectric layers and the semiconductor layer comprising germanium are removed, and a source/drain contact is formed on the source/drain region between the plurality of cap layers.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Exemplary embodiments of the invention will now be discussed in further detail with regard to semiconductor devices and methods of manufacturing same and, in particular, to selectively forming a cap layer on gate structures and spacers to form self-aligned contacts (SACs) to source/drain regions.

It is to be understood that the various layers and/or regions shown in the accompanying drawings are not drawn to scale, and that one or more layers and/or regions of a type commonly used in, for example, field-effect transistor (FET), fin field-effect transistor (FinFET), vertical transport field-effect transistor (VTFET), CMOS, nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not necessarily be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, FinFETs, VTFETs, CMOSs, nanowire FETs, nanosheet FETs, SETs, and/or MOSFETs. By way of non-limiting example, the semiconductor devices can include, but are not necessarily limited to FET, FinFET, VTFET, CMOS, nanowire FET, nanosheet FET, SET, CMOS and MOSFET devices, and/or semiconductor devices that use FET, FinFET, VTFET, CMOS, nanowire FET, nanosheet FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As used herein, "high-k" refers to dielectric materials having a relative dielectric constant greater than 7.

As used herein, "low-k" refers to dielectric materials having a relative dielectric constant less than 7, and includes ultra-low-k dielectric materials.

There is a need for techniques and structures that provide the benefits of non-SAC processes for smaller scale devices. In accordance with one or more embodiments, silicon oxide ($SiO_2$) is selectively formed over a source/drain regions by a reaction of $GeO_2$ with silicon germanium, and SAC layers are selectively formed on gate structures and adjacent spacers. After selective removal of the $SiO_2$ and silicon germanium, source/drain contacts are formed between the gate structures, with the SAC layers preventing shorting between the gate structures and the source/drain contacts.

The cross-sections in FIGS. 1B and 2-15 are taken parallel to the length of fins.

Figure 1A:
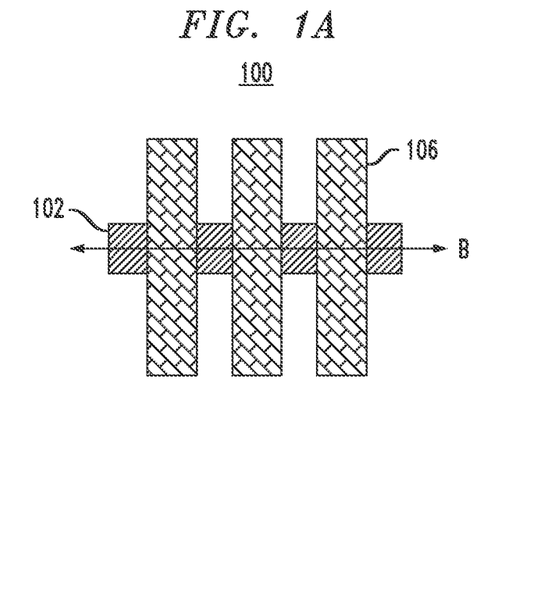
FIG. 1A is a simplified top-down view illustrating a configuration of gate structures with respect to a fin in a method of manufacturing a semiconductor device, according to an exemplary embodiment of the present invention.
Figure 1B:
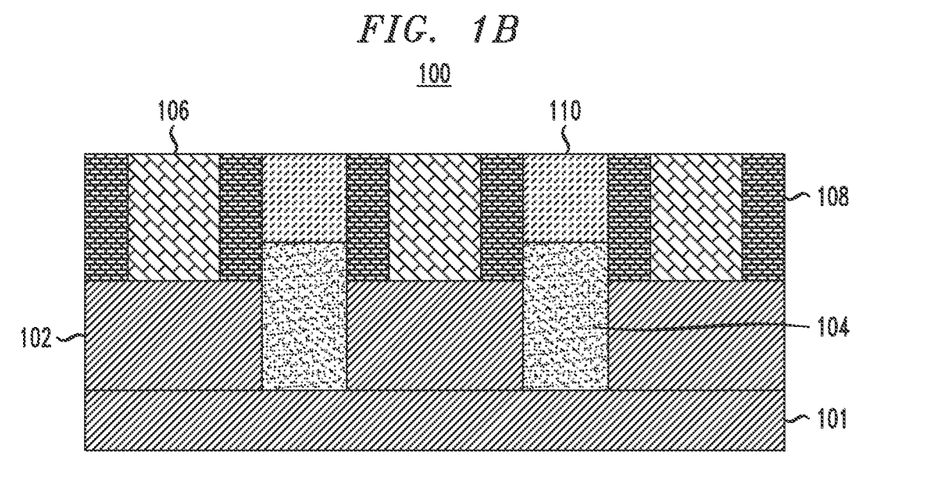
FIG. 1B is a cross-sectional view taken along the line B in FIG. 1A illustrating gate structures, spacers and source/drain regions on a fin in a method of manufacturing a semiconductor device, according to an exemplary embodiment of the present invention.

Referring to FIGS. 1A and 1B, a device 100 includes a plurality of gate structures 106 and source/drain regions 104 formed on a fin 102. The fin 102 can be formed on a semiconductor substrate 101 comprising the same or a similar material as the fin 102. The semiconductor substrate 101 includes semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), II-VI compound semiconductor or other like semiconductor. In addition, multiple layers of the semiconductor materials can be used as the semiconductor material of the substrate. The semiconductor substrate can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide or nitride layer.

Fins, such as fin 102, can be formed by patterning a portion of the semiconductor substrate or a semiconductor layer on the substrate into the fins. According to an embodiment, a hardmask including, for example, a dielectric material, such as silicon nitride (SiN), is formed on portions of the semiconductor layer that are to be formed into the fins. The fin patterning can be done by various patterning techniques, including, but not necessarily limited to, directional etching and/or a sidewall image transfer (SIT) process, for example. While the embodiments describe channel regions as fins, the embodiments are not necessarily limited to fin channel regions, and may include, for example, nanowire channel regions. FIGS. 1A, 1B and 2-15 illustrate one fin 102 or 202. Although one fin 102 or 202 is shown in the figures for ease of explanation, it is to be understood that multiple fins can be formed on a substrate and processed similarly to or the same as the fins 102 and 202 illustrated in devices 100 and 200.

As is known in the art, channels can comprise, for example, silicon, and are conducting channels that extend in a direction from a source to a drain. A fin of a FinFET protrudes vertically from a substrate and extends in a direction from a source to a drain. A nanowire can be suspended and extend between a source and a drain. As can be understood by one of ordinary skill in the art, a plurality of fins or nanowires can be formed on a substrate and spaced apart from each other at regular intervals along a gate extension direction. A plurality of gates can intersect the fins or nanowires and extend perpendicular to the extension direction of the fins or nanowires. Multiple gates can be spaced apart from each other along the extension direction of the fins or nanowires.

Dielectric layers 110 are deposited on the source/drain regions 104 adjacent the gate spacers 108. The dielectric layers 110 can be deposited using, for example, a deposition technique such as, but not necessarily limited to, chemical vapor deposition (CVD), plasma-enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), sputtering, and/or plating, followed by a planarization process such as, chemical mechanical polishing (CMP). According to an embodiment, the dielectric layers 110 are deposited directly on the source/drain regions 104, and may comprise, but are not necessarily limited to, $SiO_2$, SiOC or some other dielectric that can be selectively removed with respect to the materials of the spacers and the gate structures 106.

The gate structures 106 comprise, for example, gate dielectric and gate conductor layers. The gate dielectric layers include, for example, high-k dielectric layers formed on surfaces of the gate spacers 108 and the fin 102. The high-k dielectric layers are formed of, for example, high-k materials including, but not necessarily limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum, magnesium. The high-k dielectric material can be formed by any suitable process or any suitable combination of multiple processes, including but not necessarily limited to, thermal oxidation, chemical oxidation, thermal nitridation, plasma oxidation, plasma nitridation, ALD, CVD, etc. In some embodiments, the high-k dielectric layers have a thickness ranging from about 1 nm to about 5 nm, although less and greater thicknesses are also possible.

The gate structures further include a gate conductor layer formed on the gate dielectric (e.g., high-k) layer. The gate conductor layers can comprise any suitable conducting material, including but not necessarily limited to, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au)), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, carbon nanotube, conductive carbon, graphene, or any suitable combination of these materials. The conductive material may further comprise dopants that are incorporated during or after deposition. In some embodiments, the gate structures further comprise a work function setting layer between a gate dielectric and a gate conductor. The work function setting layer can be a work function metal (WFM). WFM can be any suitable material, including but not limited to, a nitride, including but not limited to, titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to, titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, ALD, CVD, PVD, sputtering, plating, evaporation, ion beam deposition, electron beam deposition, laser assisted deposition, chemical solution deposition, etc., followed by a planarization process. The gate structures function as gate electrodes in an operational device. N-type transistors (e.g., nFETs) and p-type transistors (e.g., pFETs) may have different WFMs.

Gate spacers 108 are formed adjacent to the gate structures 106. The gate spacers 108 are in direct contact with opposing sidewalls of the gate structures 106. The gate spacers 108 can include a dielectric insulating material such as, for example, silicon nitride (SiN), silicon oxynitride (SiON), carbon doped silicon oxynitride (SiOCN), boron nitride (BN), silicon boron nitride (SiBN), silicon boron carbon nitride (SiBCN) or multilayered stacks thereof.

Source/drain regions 104 are formed adjacent to the spacers 108 by epitaxial growth with, for example, in-situ doping or dopant implantation. The source/drain regions 104 may comprise a semiconductor material including, but not limited to, Si, SiGe, SiC, SiGeC or other like semiconductor with dopants, such as, boron, phosphorus, arsenic and any other applicable elements, depending on whether the source/drain regions are n-type or p-type regions. Similarly, the material of the fin 102 may vary depending on whether the resulting transistors are n-type or p-type devices.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 2:
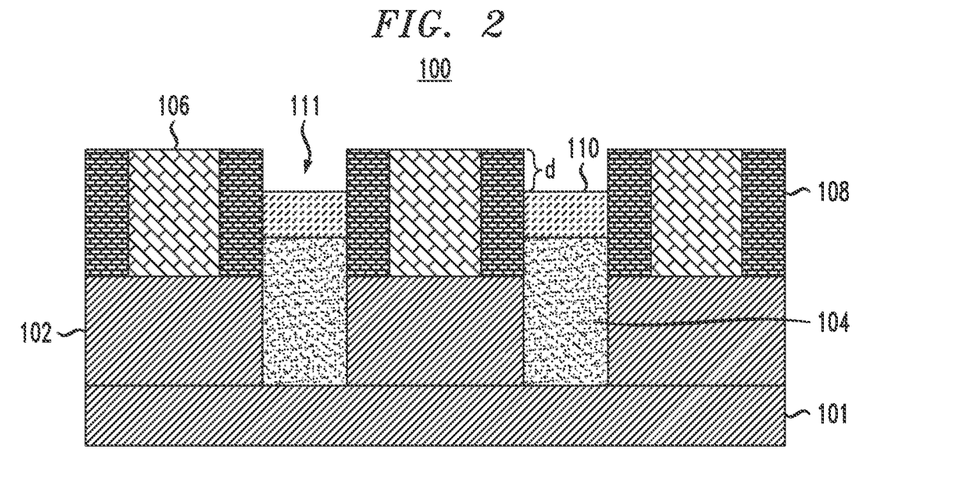
FIG. 2 is a cross-sectional view illustrating selective recessing of a dielectric layer in a method of manufacturing a semiconductor device, according to an exemplary embodiment of the present invention.

Referring to FIG. 2, the dielectric layers 110 are selectively recessed to a height below that of the gate spacers 108 and the gate structures 106 to form vacant areas 111. The recessing is performed using, for example, an etching process which selectively etches the material of the dielectric layers 110 with respect to materials of the spacers 108 and the gate structures 106. For example, in the case of dielectric layers comprising $SiO_2$ and gate spacers 108 comprising SiN, the etchant can be, for example, a fluorine-based plasma or a fluorine based chemical etchant. A depth d of the recess can be, but is not necessarily limited to, about 20 nm to about 50 nm.

Figure 3:
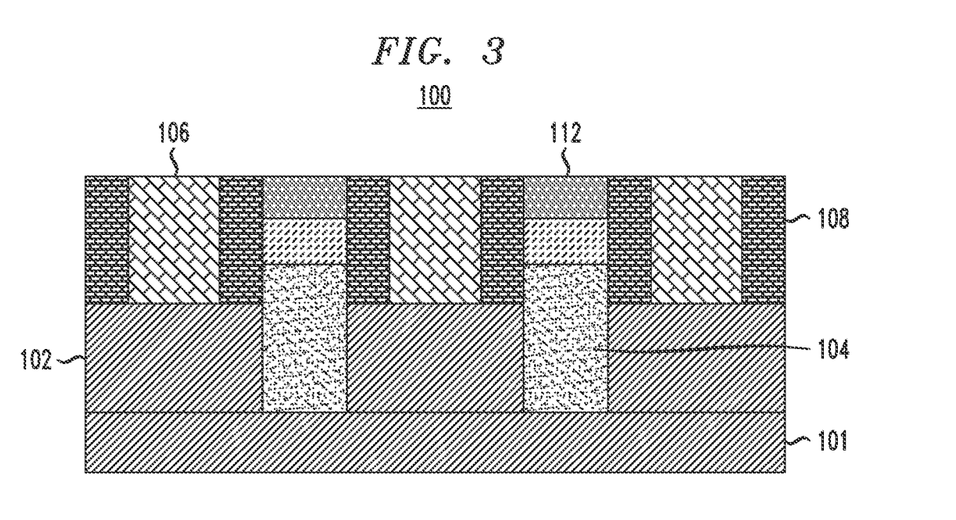
FIG. 3 is a cross-sectional view illustrating silicon germanium layer deposition in a method of manufacturing a semiconductor device, according to an exemplary embodiment of the present invention.

Referring to FIG. 3, silicon germanium (SiGe), for example, amorphous SiGe (a-SiGe), is deposited on the structure from FIG. 2, including on the recessed portions of the dielectric layers 110. The SiGe is deposited using, for example, a deposition technique such as, but not necessarily limited to, CVD, PECVD, RFCVD, PVD, ALD, MBD, PLD, and/or LSMCD, sputtering, and/or plating, followed by a planarization process such as, CMP to remove excess portions of the SiGe on top of the spacers 108 and gate structures 106. As a result of the planarization, SiGe layers 112 are formed on the recessed dielectric layers 110 and fill in the vacant areas 111. The top surfaces of the SiGe layers 112 are coplanar with the top surfaces of the gate structures 106 and the spacers 108.

Figure 4:
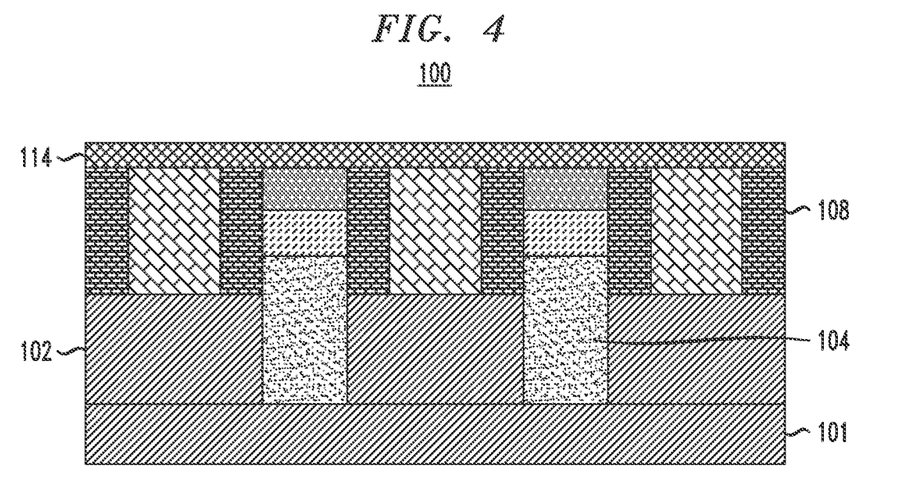
FIG. 4 is a cross-sectional view illustrating germanium oxide ($GeO_2$) layer deposition in a method of manufacturing a semiconductor device, according to an exemplary embodiment of the present invention.

Referring to FIG. 4, a sacrificial layer 114 comprising $GeO_2$ is deposited on the structure from FIG. 3 using, for example, a deposition technique such as, but not necessarily limited to, CVD, PECVD, RFCVD, PVD, ALD, MBD, PLD, and/or LSMCD, sputtering, and/or plating. The $GeO_2$ layer 114 is deposited on the spacers 108, gate structures 106 and the SiGe layers 112. In a non-limiting embodiment, a thickness of the $GeO_2$ layer 114 can be in the range of about 6 nm to about 10 nm.

Figure 5:
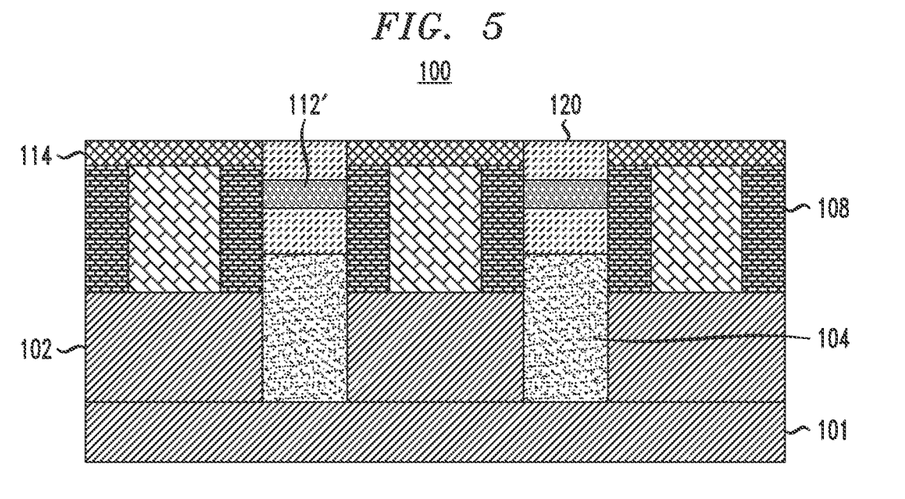
FIG. 5 is a cross-sectional view illustrating annealing to convert portions of $GeO_2$ layer in a method of manufacturing a semiconductor device, according to an exemplary embodiment of the present invention.

Referring to FIG. 5, after deposition of the $GeO_2$ layer 114, a thermal annealing process is performed in, for example, nitrogen ($N_2$), argon (Ar), helium (He), xenon (Xe), and/or hydrogen. The temperature at which the thermal annealing process is performed and the germanium concentration of the SiGe layers 112 control whether portions of the $GeO_2$ layer 114 on the SiGe layers 112 are converted into $SiO_2$ layers (e.g., layers 120). In accordance with an embodiment of the present invention, the required annealing temperature to convert $GeO_2$ layer 114 on SiGe layers 112 to $SiO_2$ layers 120 is inversely proportional to the germanium concentration in the SiGe layers 112. In other words, as the concentration of germanium in SiGe decreases, the temperature required to convert the $GeO_2$ layer to the $SiO_2$ layers increases. According to an non-limiting embodiment, the germanium concentration of the SiGe layers 112 ranges from about 20% to about 60%, and an annealing temperature is less than about 400° C.

According to an embodiment, following the annealing process, remaining SiGe layers 112' have an upper portion (e.g., portion closer to the $SiO_2$ layers 120) with a higher germanium concentration than that of a lower portion (e.g., portion closer to the $SiO_2$ layers 110).

The annealing process causes the portions of the $GeO_2$ layer 114 contacting the SiGe layers 112 to be selectively converted into the $SiO_2$ layers 120. In other words, the annealing process causes the $SiO_2$ layers 120 to be selectively formed over the source/drain regions 104. It is to be understood that the germanium concentration of the SiGe layers 112 may vary, and the annealing process conditions (e.g., temperature) may be adjusted to ensure selective formation of the $SiO_2$ layers 120 over the source/drain regions 104.

Figure 6:
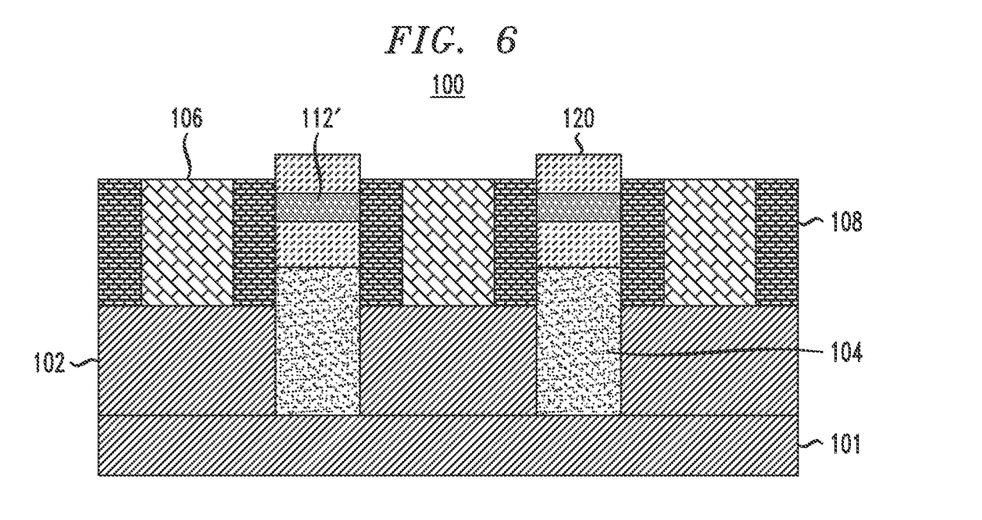
FIG. 6 is a cross-sectional view illustrating removal of remaining portions of the $GeO_2$ layer in a method of manufacturing a semiconductor device, according to an exemplary embodiment of the present invention.

Referring to FIG. 6, the unreacted portions of the $GeO_2$ layer 114 are water soluble, and removed using, for example, a water based agent, such as, for example, deionized water (DI water). The unreacted portions of the $GeO_2$ layer 114 are removed from the gate spacers 108 and gate structures 106.

Figure 7:
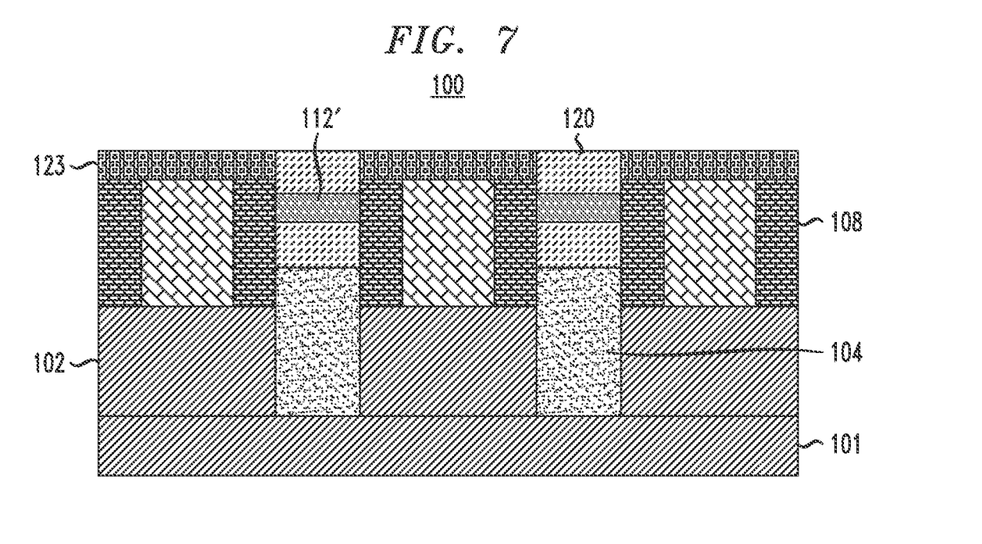
FIG. 7 is a cross-sectional view illustrating cap layer formation and planarization in a method of manufacturing a semiconductor device, according to an exemplary embodiment of the present invention.

Referring to FIG. 7, cap layers 123 are deposited on the structure from FIG. 6 using, for example, a deposition technique such as, but not necessarily limited to, CVD, PECVD, RFCVD, PVD, ALD, MBD, PLD, and/or LSMCD, sputtering, and/or plating, followed by a planarization process. The cap layers 123 are deposited on the spacers 108 and gate structures 106 and are planarized down to the dielectric layers 120 to remove portions of the cap layers 123 on the dielectric layers 120. In a non-limiting embodiment, the cap layers 123 comprise, for example, SiN, SiON, SiOCN, BN, SiBN, SiBCN or other material which permits selective removal of the dielectric layers 120 and SiGe layers 112' (see FIG. 8). A thickness of the cap layers 123 can be in the range of about 6 nm to about 10 nm.

Figure 8:
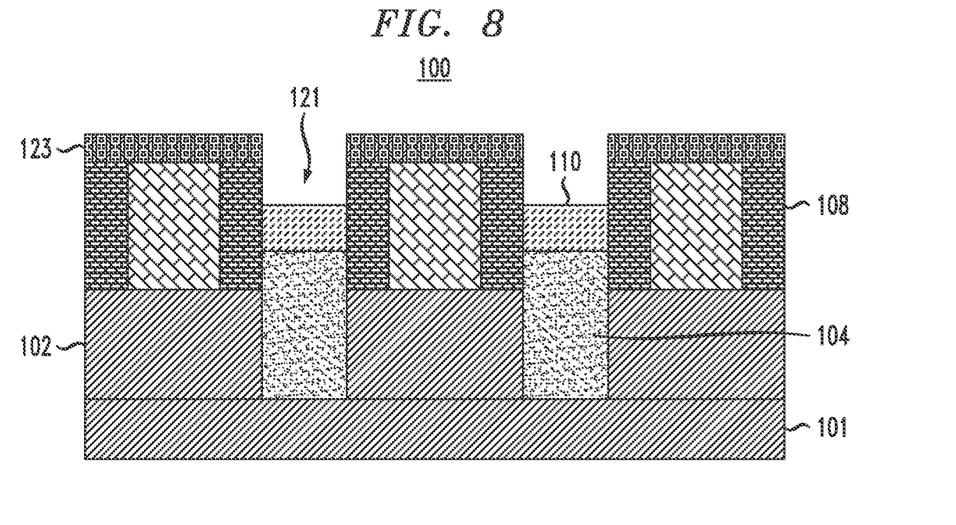
FIG. 8 is a cross-sectional view illustrating selective removal of dielectric and silicon germanium layers in a method of manufacturing a semiconductor device, according to an exemplary embodiment of the present invention.

Referring to FIG. 8, the dielectric layers 120 and SiGe layers 112' are selectively removed to form vacant areas 121 exposing top surfaces of the dielectric layers 110. The removing is performed using, for example, etching processes which selectively etch the material of the dielectric layers 120 and the material of the SiGe layers 112' with respect to the materials of the cap layer 123 and the spacers 108. For example, in the case of dielectric layers 120 comprising $SiO_2$, and cap layers 123 and gate spacers 108 comprising SiN, the etchant to remove the dielectric layers 120 can be, for example, a fluorine-based chemical etchant, and the etchant to remove the SiGe layers 112' can be, for example, a fluorine-based chemical or plasma etchant. As can be seen, the cap layers 123 are formed only on top of the gate structures 106 and gate spacers 108 (i.e., self-aligned). The cap layers 123 are also formed without recessing the gate structures 106, allowing for gate height to be controllable.

Figure 9:
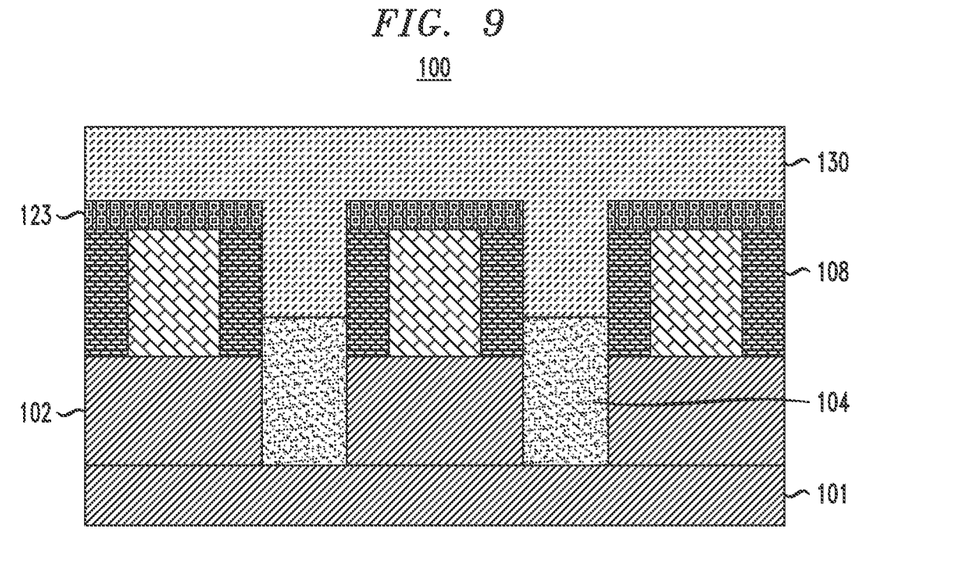
FIG. 9 is a cross-sectional view illustrating dielectric layer deposition in a method of manufacturing a semiconductor device, according to an exemplary embodiment of the present invention.

Referring to FIG. 9, a dielectric layer 130 is deposited on the structure from FIG. 8, including in the vacant areas 121 on the exposed surfaces of the dielectric layers 110, and on the exposed surfaces of the cap layers 123. The dielectric layer 130 is deposited using, for example, a deposition technique such as, but not necessarily limited to, CVD, PECVD, RFCVD, PVD, ALD, MBD, PLD, and/or LSMCD, sputtering, and/or plating. According to an embodiment, the dielectric layer 130 is deposited directly on the dielectric layers 110, the cap layers 123, and on side surfaces of the spacers 108 and may comprise, but is not necessarily limited to, $SiO_2$, SiOC or other dielectric.

Figure 10:
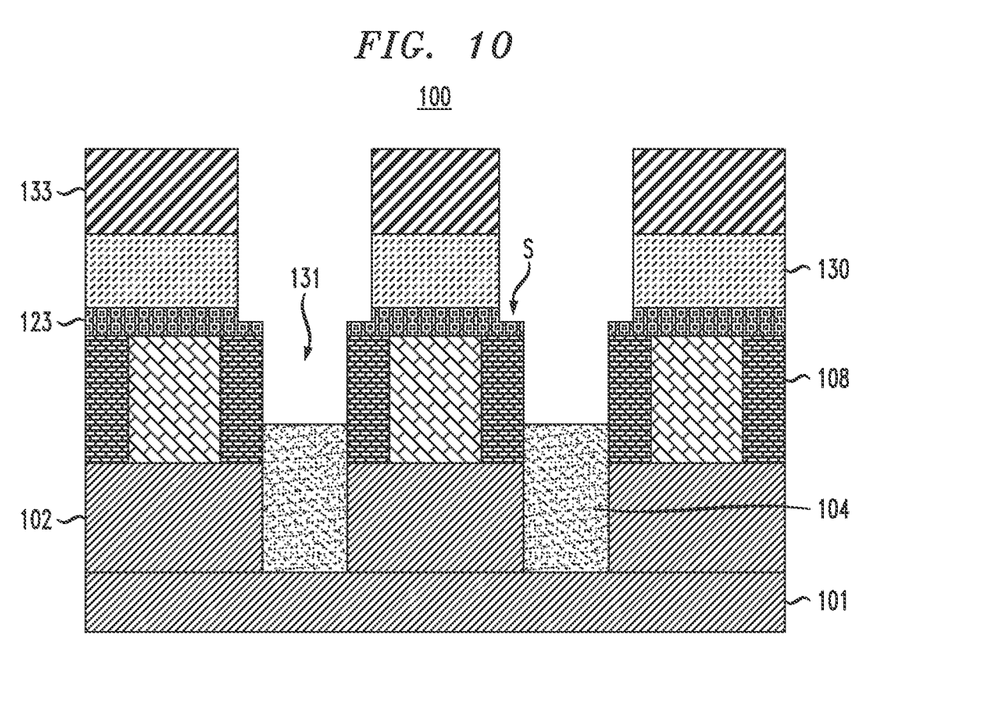
FIG. 10 is a cross-sectional view illustrating dielectric layer patterning to form openings for source/drain contacts in a method of manufacturing a semiconductor device, according to an exemplary embodiment of the present invention.

Referring to FIG. 10, the dielectric layers 110 and portions of the dielectric layer 130 on the source/drain regions 104 are removed to form vacant areas 131. According to an embodiment, masks 133 comprising, for example, an organic planarization layer such as, for example, spin-on carbon, are formed on parts of the dielectric layer 130 on at least parts of the cap layers 123. The cap layers 123 are formed on the gate structures 106 and the spacers 108. The portions of the dielectric layer 130 and underlying dielectric layers 110 not covered by the masks 133 are removed using, for example, an etch process comprising fluorocarbon plasma with a high carbon to fluorine ratio, such as c-$C_4F_8$, $C_5F_8$, $C_4F_6$. The removal of the dielectric layers 110 and the portions of the dielectric layer 130 left exposed by the masks 133 exposes top surfaces of the source/drain regions 104. As can be seen in FIG. 10, portions of the cap layers 123 not covered by the masks 133 may be removed during etching of the dielectric layers 110 and 130 to form stepped portions S.

Figure 11:
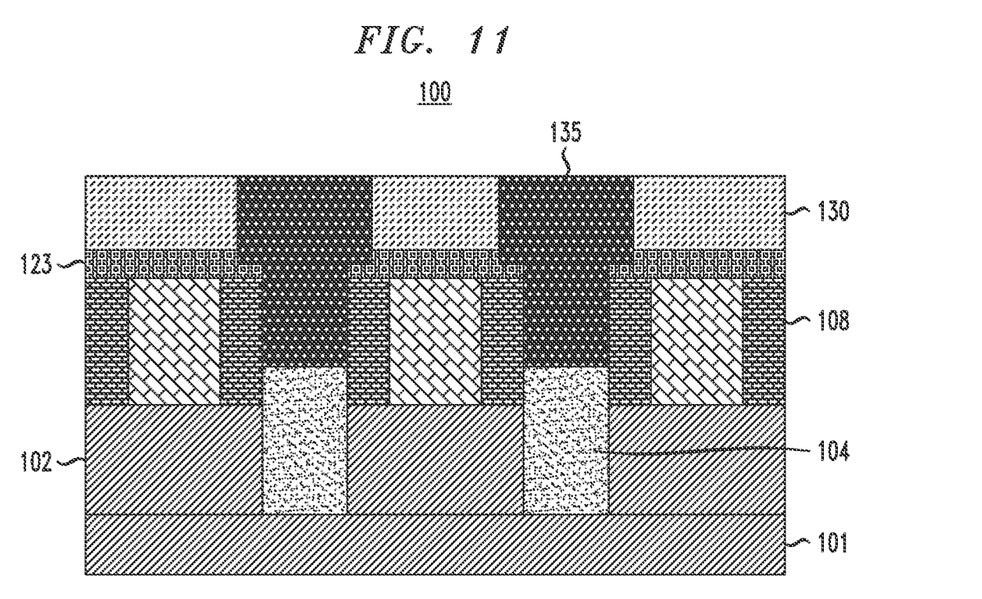
FIG. 11 is a cross-sectional view illustrating source/drain contact formation in a method of manufacturing a semiconductor device, according to an exemplary embodiment of the present invention.

Referring to FIG. 11, following removal of the masks 133, source/drain contact structures 135 are formed in the vacant areas 131 over the source/drain regions 104 and on the stepped portions S of the cap layers 123. The source/drain contact structures 135 include contact material, such as, for example, electrically conductive material including, but not necessarily limited to, tungsten, cobalt, zirconium, tantalum, titanium, aluminum, ruthenium, and/or copper. The electrically conductive material of the source/drain contact structures 135 can be deposited using, for example, a deposition technique, such as CVD, PECVD, RFCVD, PVD, ALD, MBD, PLD, LSMCD, sputtering, and/or plating, followed by a planarization process such as CMP, to remove excess contact material on top surfaces of the remaining portions of the dielectric layer 130. The cap layers 123, which are self-aligned over the gate structures 106 and spacers 108, prevent shorting between gate structures 106 and source/drain contact structures 135. Top surfaces of the gate structures 106 are coplanar with top surfaces of the spacers 108, and the cap layers 123 contact the top surfaces of the gate structures 106 and the spacers 108.

Figure 12:
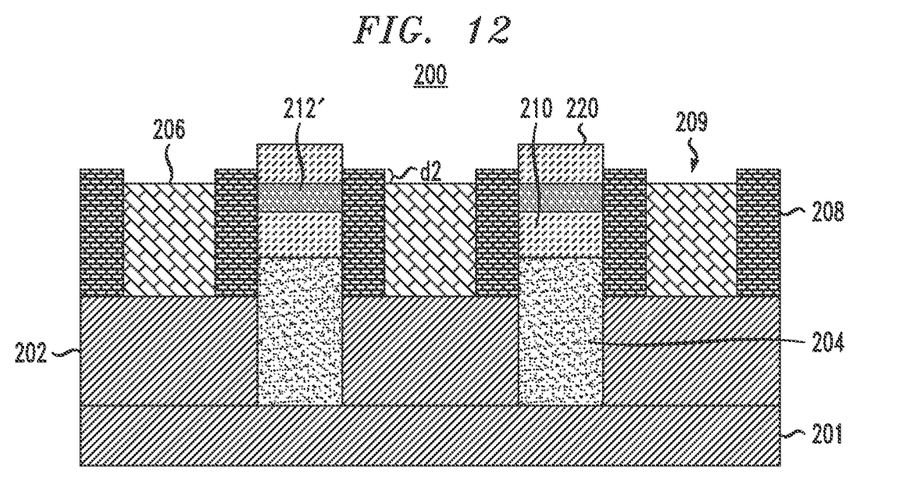
FIG. 12 is a cross-sectional view illustrating gate structure recessing following removal of remaining portions of a $GeO_2$ layer in a method of manufacturing a semiconductor device, according to an exemplary embodiment of the present invention.

Referring to FIG. 12, following processing described in FIGS. 1-6, in a device 200, gate structures 206 are recessed. The device 200 in FIGS. 12-19 includes the same or similar elements to those in device 100 described in connection with FIGS. 1A, 1B and 2-11. For example, like the substrate 101, fin 102, source/drain regions 104, gate structures 106, gate spacers 108, dielectric layers 110, SiGe layers 112' and dielectric layers 120 in device 100, the device 200 comprises a substrate 201, fin 202, source/drain regions 204, gate structures 206, gate spacers 208, dielectric layers 210, SiGe layers 212' and dielectric layers 220. These elements in device 200 are manufactured using the same or similar processes and include the same or similar materials to those discussed in connection with device 100.

Different from the device 100, the gate structures 206 are recessed slightly following removal of remaining portions of a $GeO_2$ layer as described in connection with FIG. 6. As shown in FIG. 12, the gate structures 206 are selectively recessed to a height below that of the gate spacers 208. For example, the gate structures 206 are recessed to a depth d2 in the range of about 10 nm to about 20 nm to form vacant areas 209. The recessing of the gate structures 206 is performed using, for example, an etching process comprising a chlorine-based plasma.

Figure 13:
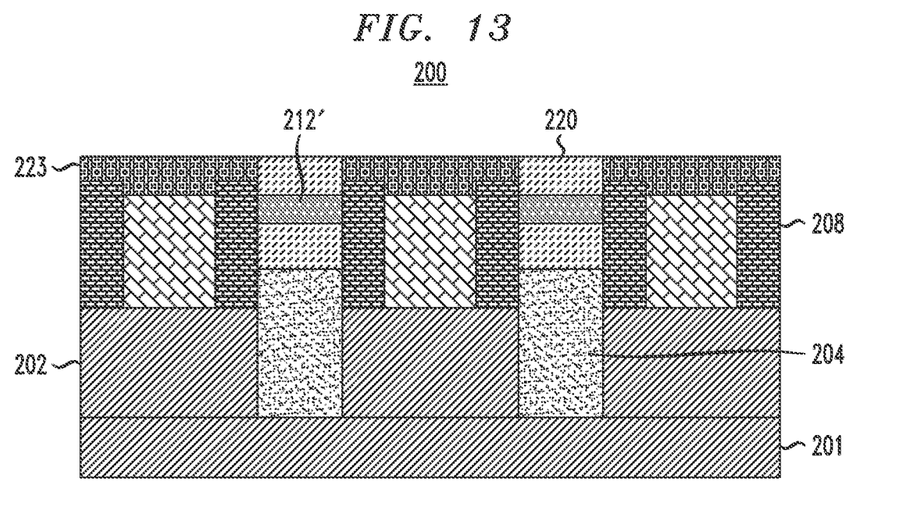
FIG. 13 is a cross-sectional view illustrating cap layer formation and planarization in a method of manufacturing a semiconductor device, according to an exemplary embodiment of the present invention.

Referring to FIG. 13, similar to what is described in connection with FIG. 7, cap layers 223 are deposited using, for example, a deposition technique such as, but not necessarily limited to, CVD, PECVD, RFCVD, PVD, ALD, MBD, PLD, and/or LSMCD, sputtering, and/or plating, followed by a planarization process. The cap layers 223 are deposited on the spacers 208 and on the recessed gate structures 206 in the portions 209 between the gate spacers 208, and are planarized down to the dielectric layers 220 to remove portions of the cap layers 223 on the dielectric layers 220. In a non-limiting embodiment, the cap layers 223 comprise, for example, SiN, SiON, SiOCN, BN, SiBN, SiBCN or other material which permits selective removal of the dielectric layers 220 and SiGe layers 212' (see FIG. 14). A thickness of the cap layers 223 can be in the range of about 6 nm to about 10 nm.

Figure 14:
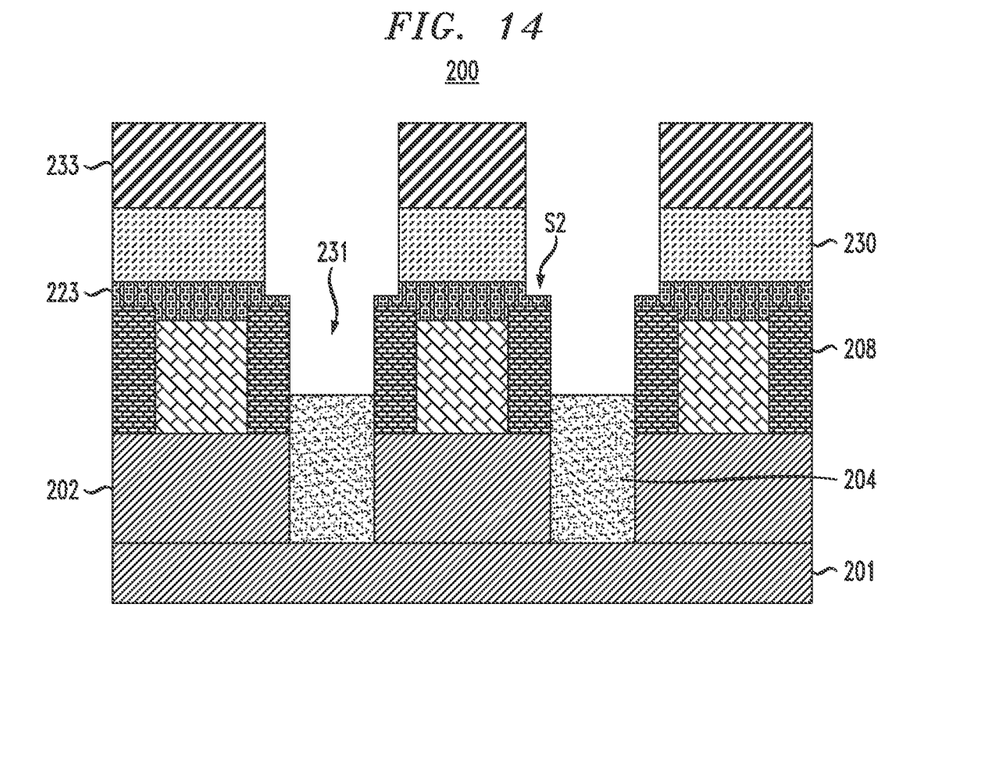
FIG. 14 is a cross-sectional view illustrating dielectric layer patterning to form openings for source/drain contacts in a method of manufacturing a semiconductor device, according to an exemplary embodiment of the present invention.

Referring to FIG. 14, the processing follows the same or a similar flow to that described in connection with FIGS. 8-9, including the steps of selective removal of the $SiO_2$ layers 220 formed as a result of annealing and underlying remaining silicon germanium layers 212' to expose dielectric layers 210, and deposition of a dielectric layer 230. The dielectric layer 230 includes the same or similar material and is deposited using the same or similar techniques as those of the dielectric layer 130 discussed in connection with FIG. 9.

Similar to the processing discussed in connection with FIG. 10, the dielectric layers 210 and portions of the dielectric layer 230 on the source/drain regions 204 are removed to form vacant areas 231. According to an embodiment, masks 233 comprising, for example, an organic planarization layer such as, for example, spin-on carbon, are formed on parts of the dielectric layer 230 on at least parts of the cap layers 223. The cap layers 223 are formed on the gate structures 206 and the spacers 208. The portions of the dielectric layer 230 and underlying dielectric layers 210 not covered by the masks 233 are removed using, for example, an etch process comprising fluorocarbon plasma with a high carbon to fluorine ratio, such as c-$C_4F_8$, $C_5F_8$, $C_4F_6$. The removal of the dielectric layers 210 and the portions of the dielectric layer 230 left exposed by the masks 233 exposes top surfaces of the source/drain regions 204. As can be seen in FIG. 14, portions of the cap layers 223 not covered by the masks 233 may be removed during etching of the dielectric layers 210 and 230 to form stepped portions S2.

Figure 15:
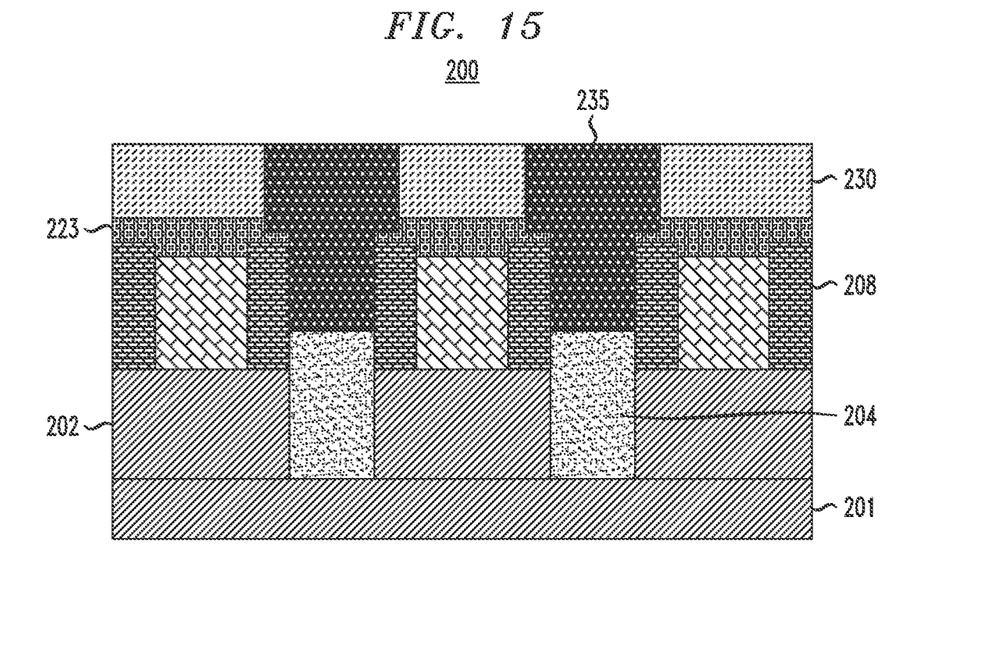
FIG. 15 is a cross-sectional view illustrating source/drain contact formation in a method of manufacturing a semiconductor device, according to an exemplary embodiment of the present invention.

Referring to FIG. 15, similar to the processing discussed in connection with FIG. 11, following removal of the masks 233, source/drain contact structures 235 are formed in the vacant areas 231 over the source/drain regions 204 and on the stepped portions S2 of the cap layers 223. The source/drain contact structures 235 include contact material the same or similar to that of the source/drain contact structures 135. The electrically conductive material of the source/drain contact structures 235 can be deposited using, for example, a deposition technique, such as CVD, PECVD, RFCVD, PVD, ALD, MBD, PLD, LSMCD, sputtering, and/or plating, followed by a planarization process such as CMP, to remove excess contact material on top surfaces of the remaining portions of the dielectric layer 230. The cap layers 223, which are self-aligned over the recessed gate structures 206 and spacers 208, prevent shorting between gate structures 206 and source/drain contact structures 235. The recess of the gate structures 206 further distances the gate structures 206 from the source/drain contact structures 235 on the stepped portions S2 than the distance between the gate structures 106 and the source/drain contact structures 135 on the stepped portions S in FIG. 11. Top surfaces of the gate structures 206 are recessed with respect to top surfaces of the spacers 208, and the cap layers 223 contact the top surfaces of the gate structures 206 and the top surfaces of the spacers 208.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor device, comprising:
   a plurality of gate structures disposed on a semiconductor fin;
   a plurality of spacers disposed on sides of the plurality of gate structures;
   a plurality of cap layers disposed on the plurality of gate structures and on the plurality of spacers;
   wherein the plurality of cap layers each comprise a stepped portion; and
   wherein respective ones of the stepped portions are positioned over an underlying spacer of the plurality of spacers without extending over a gate structure of the plurality of gate structures disposed adjacent the underlying spacer;
   a plurality of source/drain regions disposed adjacent the plurality of gate structures; and
   a plurality of source/drain contacts disposed on the plurality of source/drain regions;
   wherein the plurality of source/drain contacts are disposed between the plurality of cap layers and the plurality of gate structures.

2. The semiconductor device according to claim 1, wherein:
   top surfaces of the plurality of gate structures are coplanar with top surfaces of the plurality of spacers; and
   the plurality of cap layers contact the top surfaces of the plurality of gate structures and the plurality of spacers.

3. The semiconductor device according to claim 1, wherein:
   top surfaces of the plurality of gate structures are recessed with respect to top surfaces of the plurality of spacers; and
   the plurality of cap layers contact the top surfaces of the plurality of gate structures and the top surfaces of the plurality of spacers.

4. The semiconductor device according to claim 1, wherein portions of the plurality of source/drain contacts are positioned on the stepped portions.

5. The semiconductor device according to claim 1, wherein respective ones of the plurality of source/drain contacts comprise an upper portion and a lower portion, wherein the upper portion has a greater width than the lower portion.

6. The semiconductor device according to claim 1, wherein respective ones of the plurality of cap layers comprise lateral edges which are coplanar with lateral edges of respective ones of the plurality of spacers.

7. The semiconductor device according to claim 6, wherein the plurality of source/drain contacts contact the coplanar lateral edges of the plurality of cap layers and of the plurality of spacers.

8. The semiconductor device according to claim 1, further comprising a plurality of dielectric layers disposed on the plurality of cap layers.

9. A semiconductor device, comprising:
   a plurality of gate structures disposed on a channel region;
   a plurality of spacers disposed on sides of the plurality of gate structures;
   a plurality of cap layers disposed on the plurality of gate structures and on the plurality of spacers;
   wherein the plurality of cap layers each comprise a stepped portion; and
   wherein respective ones of the stepped portions are positioned over an underlying spacer of the plurality of spacers without extending over a gate structure of the plurality of gate structures disposed adjacent the underlying spacer;
   a plurality of source/drain regions disposed adjacent the plurality of gate structures; and
   a plurality of source/drain contacts disposed on the plurality of source/drain regions;
   wherein the plurality of source/drain contacts are disposed between the plurality of cap layers and the plurality of gate structures.

10. The semiconductor device according to claim 9, wherein:
    top surfaces of the plurality of gate structures are coplanar with top surfaces of the plurality of spacers; and
    the plurality of cap layers contact the top surfaces of the plurality of gate structures and the plurality of spacers.

11. The semiconductor device according to claim 9, wherein portions of the plurality of source/drain contacts are positioned on the stepped portions.

12. The semiconductor device according to claim 9, wherein:
    top surfaces of the plurality of gate structures are recessed with respect to top surfaces of the plurality of spacers; and the plurality of cap layers contact the top surfaces of the plurality of gate structures and the top surfaces of the plurality of spacers.

13. The semiconductor device according to claim 9, wherein respective ones of the plurality of source/drain contacts comprise an upper portion and a lower portion, wherein the upper portion has a greater width than the lower portion.

14. The semiconductor device according to claim 9, wherein respective ones of the plurality of cap layers comprise lateral edges which are coplanar with lateral edges of respective ones of the plurality of spacers.

15. The semiconductor device according to claim 14, wherein the plurality of source/drain contacts contact the coplanar lateral edges of the plurality of cap layers and of the plurality of spacers.

16. The semiconductor device according to claim 9, further comprising a plurality of dielectric layers disposed on the plurality of cap layers.

\* \* \* \* \*